United States Patent [19]

Takahashi

[11] Patent Number: 5,233,337
[45] Date of Patent: Aug. 3, 1993

[54] LIGHT-EMITTING APPARATUS
[75] Inventor: Masaru Takahashi, Yokohama, Japan
[73] Assignee: Eastman Kodak Company, Rochester, N.Y.
[21] Appl. No.: 850,762
[22] Filed: Mar. 13, 1992
[30] Foreign Application Priority Data Apr. 2, 1991 [JP] Japan ................... 3-070143

[51] Int. Cl.[5] .............................. G09G 3/32
[52] U.S. Cl. ..................... 340/782; 340/762; 346/107 R
[58] Field of Search ............. 346/107 R, 108; 368/83, 368/241; 340/782, 762

[56] References Cited
U.S. PATENT DOCUMENTS

| | | | |
|---|---|---|---|
| 4,229,750 | 10/1980 | Kawamura et al. | 346/107 R |
| 4,750,010 | 6/1988 | Ayers et al. | 346/107 R |
| 4,780,731 | 10/1988 | Creutzmann et al. | 346/107 R X |
| 4,835,549 | 5/1989 | Samejima et al. | 346/107 R X |
| 4,918,462 | 4/1990 | Tomita et al. | 346/107 R |
| 4,939,529 | 7/1990 | Kanayama et al. | 346/107 R X |

Primary Examiner—Ulysses Weldon
Attorney, Agent, or Firm—Raymond L. Owens

[57] ABSTRACT

Light-emitting apparatuses are disclosed for use in an Light Emitting Diode (LED) printer or the like that include an LED array and a LED array driver integrated circuit (IC). The LED driver IC includes register and latching means for receiving and storing externally provided LED array drive signals, strobe signal generating means for sequentially generating strobe signals with mutually different time delays, and strobing circuitry. The strobing circuitry is used to control the operation of the LEDs of the LED array by generating a logical product (AND) of the LED array drive signals from the register and latching means and the strobe signals from the strobe signal generating means to provide sequential drive signals to different sections of the LEDs of the LED array that are based on the strobe signals from the strobe signal generating means. Clock generating circuitry is included in certain embodiments of the present LED array driver ICs for providing the strobe signal generating means with clock signals of a predetermined controllable frequency.

12 Claims, 7 Drawing Sheets

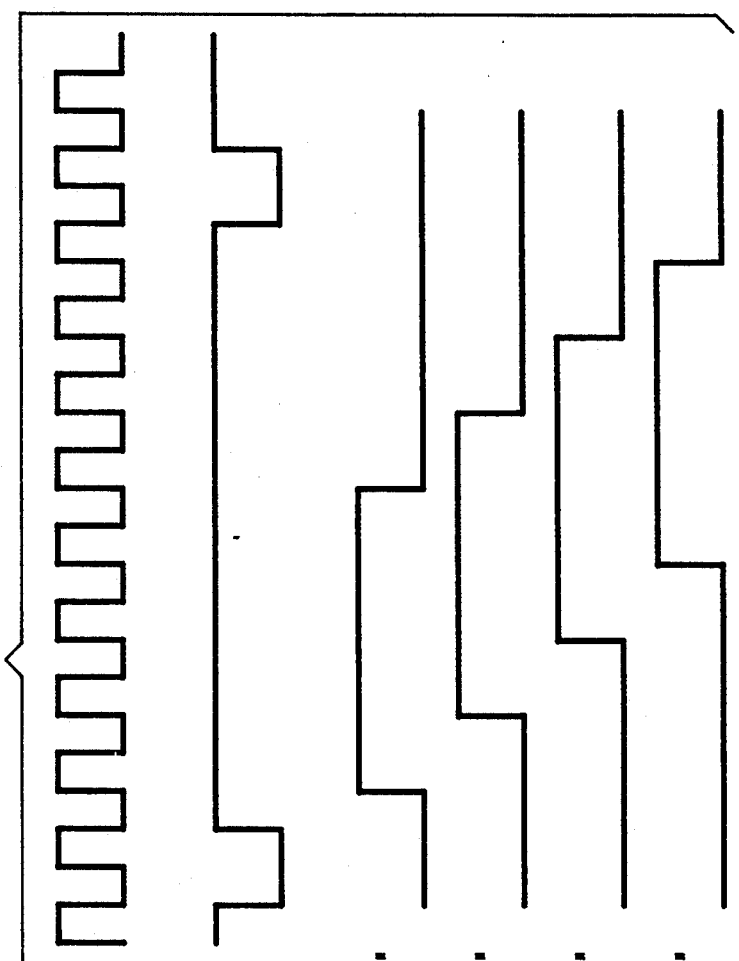

LIGHT-EMITTING APPARATUS

FIELD OF THE INVENTION

The present invention relates to a light-emitting apparatus, and, more particularly, to a light-emitting apparatus comprising an LED array applied to an electrophotographic type optical printer.

BACKGROUND OF THE INVENTION

Electrophotographic type optical printers that use a laser light source are well known. More recently, however, optical printers using an LED array as the light source have been devised. Such LED array optical printers require a light-emitting apparatus for suitably modulating light emitted by the LED array, and exposing the target image on a photosensitive drum.

Referring now to FIG. 1, there is shown a general arrangement of a prior art light-emitting apparatus 10. In apparatus 10, an input board 12, an input connector 14, and a spreader board 16 are assembled on a motherboard 18. Light Emitting Diode (LED) array driver integrated circuits (IC) 20 and an LED array 22 are integrated on the motherboard 18. The LED array 22 comprises well over a hundred LEDs (not shown) arranged in a row. Wire bondings 24 are used to electrically connect (a) the input board 12 and the spreader board 16, (b) the spreader board 16 and the LED array driver ICs 20, and (c) the LED array driver ICs 20 and the LED array 22. A focussing rod-lens array (not shown) is disposed over the LED array 22 for focussing light from the LED array 22 onto a photosensitive drum (not shown in the optical printer).

Referring now to FIG. 2, there is shown a configuration of the LED array driver IC 20 of the prior art light-emitting apparatus 10 shown in FIG. 1. Each LED array driver IC 20 comprises a shift register 30, a latch circuit 34, a strobe circuit 35 comprising AND circuits 36, a drive circuit 37, a data input pad 38, a data output pad 39, a latch input pad 40, a strobe input pad 42, output pads 44 (three of which are labeled), and a clock input pad 46. The data input pad 38, data output pad 39, latch input pad 40, and strobe input pad 42 are connected to the spreader board 16 by the wire bondings 24 (shown only in FIG. 1), and the output pads 44 are connected to the LED array 22 by the wire bondings 24.

In the operation of the light-emitting apparatus 10, drive signal data (in serial form), clock signals, control signals, and power are inputted to the spreader board 16 via the input connector 14 and input board 12. Such power and other signals from the spreader board 16 are then inputted to the LED array driver IC 20 via the pads 38, 40, and 42. In the LED array driver IC 20, the serial drive (emission) signal data is converted to parallel form and used to drive LEDs 23 of the LED array 22 in accordance with the supplied control signals from the strobe input pad 42.

The drive data signals coming from the spreader board 16 are inputted to the shift register 30 via the data input pad 38. In the shift register 30, the drive data is shifted from left to right in accordance with clock signals inputted from the spreader board 16 via the clock input pad 46. From the shift register 30, the drive data signals thus shifted to the right are outputted from the data output pad 39 and, via the spreader board 16, are inputted to the data input pad 38 of the next LED array driver IC 20 to the right. When one entire line of print signal data is thus prepared representing on/off data for each LED, it is latched by the latch circuit 34 in accordance with control signals inputted via the latch input pad 40.

An AND operation at each AND gate 36 is then applied to the associated (a) latched data signals inputted to the strobe circuit 35 via the latch circuit 34, and (b) strobe control signals inputted to the strobe circuit 35 via the strobe input pad 42, to thereby determine an LED emission exposure time. Exposure signals outputted along each of the channels from the AND circuits 36 by the strobe circuit 35 are converted by the drive circuit 37 to prescribed drive currents used to operate the respective LEDs 23 of the LED array 22.

To energize all of the LEDs 23, it is necessary to operate all of the strobe circuit channels simultaneously. This causes the type of large current pulses graphically shown in FIG. 3. If each LED draws 5 mA, and the apparatus 10 has a total of 5,000 LEDs 23, the result is a square-shaped 25-amp pulse. Such pulses generate wide-ranging electromagnetic radiation interference (EMI) in the signal and power supply (not shown) which degrades print quality.

A further problem is that, owing to the inductance and resistance components in power supply lines of the driver array ICs 20, the wiring of the spreader board 16, and the power cable connected to the apparatus 10, large pulses of current such as these result in a decrease in the voltage going to the array driver ICs 20, producing both variations in optical output and degraded print quality.

SUMMARY OF THE INVENTION

The present invention is directed to a light-emitting apparatus that does not generate electromagnetic radiation interference (EMI), and, therefore, enables high quality print to be obtained. The light-emitting apparatus in accordance with the present invention comprises an array of a plurality of light emitting diodes (LEDs) and LED array driver integrated circuit (IC) means. The LED array driver IC means comprises register and latching means for receiving and storing LED array drive signals, strobe signal generating means for sequentially generating strobe signals with mutually different time delays, and strobing circuitry. The strobing circuitry is used to control the operation of the LEDs of the LED array. This is done by generating a logical product (AND) of the LED array drive signals from the register and latching means, and the strobe signals from the strobe signal generating means to provide sequential drive signals to different sections of the LEDs of the LED array that are based on the strobe signals from the strobe signal generating means.

In certain embodiments of the present light-emitting apparatus the LED array driver IC means further comprises clock generating circuitry for providing the strobe signal generating means with clock signals of a predetermined controllable frequency.

With the light-emitting apparatus thus configured according to the present invention, the strobe generating circuit is used to operate the LEDs sequentially and thereby prevent EMI caused by instantaneous flows of large current in the light-emitting apparatus. The further addition of a clock generating circuit prevents EMI which otherwise accompanies clock signals input from a motherboard.

The invention and its various advantages will be better understood from the following more detailed description taken with the accompanying drawings and claims.

BRIEF DESCRIPTION OF THE DRAWINGS

FIG. 5 is a timing diagram of clock, clear, and strobe generator input signals for the first embodiment of FIG. 4;

DETAILED DESCRIPTION

Figure 4:
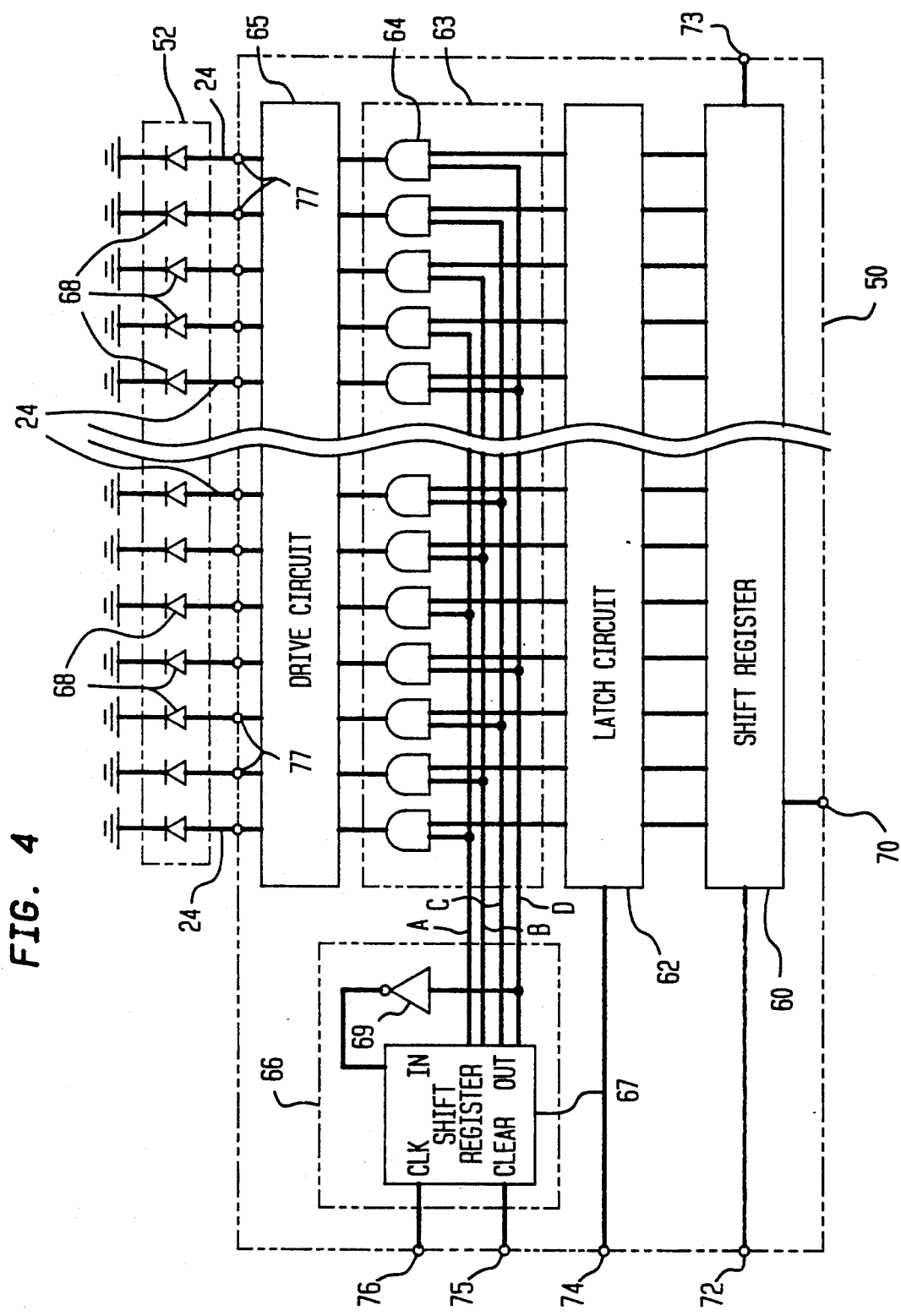
FIG. 4 shows an arrangement of an LED array driver IC and LED array in a light emitting apparatus similar to FIG. 1 in accordance with a first embodiment of the present invention.

Referring now to FIG. 4, there is shown an arrangement of a Light Emitting Diode (LED) array driver integrated circuit (IC) 50 (shown in a first dashed line rectangle), and an LED array 52 (shown in a second dashed line rectangle) in accordance with a first embodiment of the present invention. It is to be understood that the LED array driver IC 50 and the LED array 52 of FIG. 4 are useful as replacements for the combination of the LED array driver IC 20 and the LED array 22, respectively, shown in the light-emitting apparatus 10 of FIG. 1 to form a modified light-emitting apparatus in accordance with the first embodiment of the present invention.

The LED array 52 comprises a plurality of LEDs 68 which are coupled to the LED array driver IC 50 via wire bondings 24. The LED array driver IC 50 comprises a shift register 60, a latch circuit 62, a strobe circuit 63 (shown within a dashed line rectangle), AND circuits 64, a drive circuit 65, a strobe signal generator 66 (shown within a dashed line rectangle), a clock input pad 70, a data input pad 72, a data output pad 73, a latch input pad 74, a clear signal input pad 75, a second clock input pad 76, and output pads 77. Each of the output pads 77 are connected to a separate LED 68 of the LED array 52 via a separate wire bonding 24. The strobe signal generator 66 comprises a shift register 67 and an inverter 69. The shift register 67 comprises a first input designated "CLK" which is connected to the clock input pad 76, a second input designated "CLEAR" which is connected to the clear signal input pad 75, a third input designated "IN" and four outputs connected to output lines designated A, B, C, and D which are each connected in a predetermined sequence to a separate section of the AND gates 64. The inverter 69 comprises an input coupled to the "D" output line of the shift register 67, and an output connected to the third input (IN) of the shift register 67. The clock input pad 70, data input pad 72, data output pad 73, latch input pad 74, clear signal input pad 75, and second clock input pad 76 are connected to the spreader board 28 (shown only in FIG. 1) by wire bondings 24 (shown only in FIG. 1). The output pads 77 are connected to separate ones of the LEDs 68 of the LED array 52 via the wire bondings 24.

LED serial drive data signals from the spreader board 28 (shown in FIG. 1) are inputted to the shift register 60 via the data input pad 72. In the shift register 60, the serially inputted drive data signals are shifted from left to right in accordance with clock signals inputted from the spreader board 28 via the clock input pad 70. After the drive data signals have undergone this shift to the right, the data signals are outputted via the data output pad 73 and are transferred, via the spreader board 28, to the data input pad 72 of the next LED array driver IC 50 to the right. As in the prior art arrangement of FIG. 1, when one entire line of print signal data has thus been prepared (representing the on/off data for each LED 68), it is latched by the latch circuit 62 in accordance with control signals received via the spreader board 28 at the latch input pad 74. The LED emission exposure time for the latched data signals stored in the latch circuit 62 are determined by the AND circuits 64 of the strobe circuit 63. More particularly, the exposure time of the latched data signals to the drive circuit 65 are determined by the control signals transmitted by the strobe signal generator 66 via the output leads A, B, C, and D.

In this first embodiment of the present invention of FIG. 4, four control signals are inputted to the AND circuits 64, and a different time delay is applied by the strobe signal generator 66 to the exposure signals generated by each of the sections of the AND gates 64. The strobe signal generator 66 is, for example, a "Johnson counter" comprising the second shift register 67 and the inverter 69, and is provided with the second clock input pad 76 for the input of clock signals to operate the "counter", and the clear signal input pad 75 for the input of clear signals for controlling the "counter".

Referring now to FIG. 5, there is shown a timing diagram of "clock" signals inputted to the second clock input pad 76, "clear" signals inputted to the clear signal input pad 75, and "strobe" signals outputted from the strobe signal generator 66 on leads A, B, C, and D. More particularly, the top line designated (a) of the timing diagram shows the clock signals inputted to the second clock input pad 76 and supplied to the "CLK" input of the shift register 67 of the strobe signal generator 66. The second line from the top of the timing diagram and designated (b) shows the clear signals inputted to the clear signal input pad 75 and supplied to the "CLEAR" input of the shift register 67 of the strobe signal generator 66. The bottom four lines designated (c), (d), (e) and (f) of the timing diagram show strobe signals at points A, B, C and D, respectively, at the outputs of the strobe signal generator 66. Each of the strobe signals at outputs A, B, C, and D of strobe signal generator 66 is given a different time-delay and then inputted to a separate section of the AND circuits 64 of the strobe circuit 63. Exposure signals are generated by the AND circuits 64 of the strobe circuit 63 and outputted along each of the channels at the output of the AND circuits 64. These exposure signals are converted by the drive circuit 65 to predetermined drive signals used to operate the LEDs 68 of the LED array 52.

Figure 6:
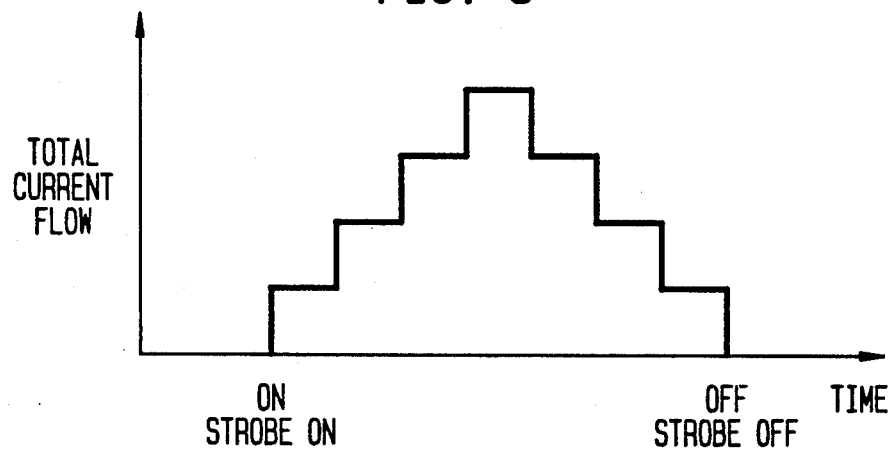
FIG. 6 is an explanatory timing diagram showing current flow levels for the first embodiment of FIG. 4.

Referring now to FIG. 6, there is graphically shown a timing diagram of the total current that flows in the light-emitting apparatus of the first embodiment of FIG. 4 from the operation of the strobe signal generator 66 to stimulate emission by all of the LEDs 68. The operation starts with one-fourth of the LEDs 68 being energized at a time, and proceeds finally to all of the LEDs 68 being energized. Then, after a predetermined elapsed time where all of the LEDs 68 are in operation, the LEDs are de-energized one-fourth at a time. The operation of the strobe signal generator 66 as shown in FIG. 6 is more clearly seen when also referring to FIGS. 4 and 5. More particularly, the operation of the strobe signal generator 66 starts with the output "A" going high (see FIG. 5) to enable one-fourth of the AND circuits 64 that are connected to the output "A" as shown in FIG. 4. This causes one-fourth of the LEDs 68 to be energized which are connected via the drive circuit 65 to the AND circuits 64 enabled by the "B" output. After a predetermined time delay and while the output "A" is still high, the output "B" of the strobe generator 66 goes high (see FIG. 5), to enable a second one-fourth of the AND circuits 64 that are connected to the output "B" as shown in FIG. 4. This energizes a second one-fourth of the LEDs 68 which are connected via the drive circuit 65 to the AND circuits 64 enabled by the "B" output. After a second predetermined time delay and while the outputs "A" and "B" are still high, the output "C" of the strobe generator 66 goes high (see FIG. 5), to enable a third one-fourth of the AND circuits 64 that are connected to the output "C" as shown in FIG. 4. This energizes a third one-fourth of the LEDs 68 which are connected via the drive circuit 65 to the AND circuits 64 enabled by the "C" output. After a third predetermined time delay and while the outputs "A", "B" and "C" are still high, the output "D" of the strobe generator 66 goes high (see FIG. 5), to enable the remaining onefourth of the AND circuits 64 that are connected to the output "D" as shown in FIG. 4). This energizes the remaining one-fourth of the LEDs 68 which are connected via the drive circuit 65 to the AND circuits 64 enabled by the "D" output. Then, after a predetermined elapsed time when all of the LEDs 68 are in operation, the LEDs are de-energized one-fourth at a time in a similar manner. More particularly, as each of the outputs "A", "B", "C", and "D" go low in sequential order as shown in FIG. 5, the associated one-fourth of the AND circuits 64 are disabled and the associated LEDs 68 are de-energized.

Figure 1:
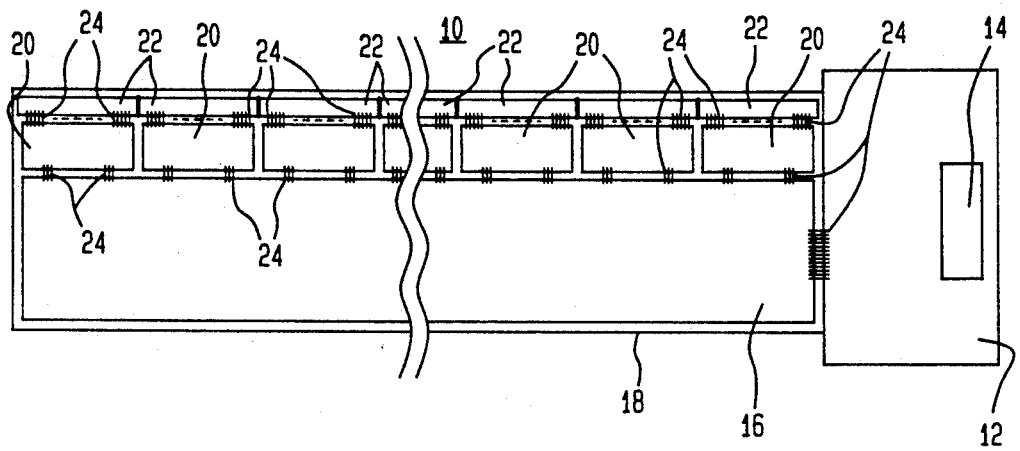
FIG. 1 shows an arrangement of a prior art light-emitting apparatus.
Figure 2:
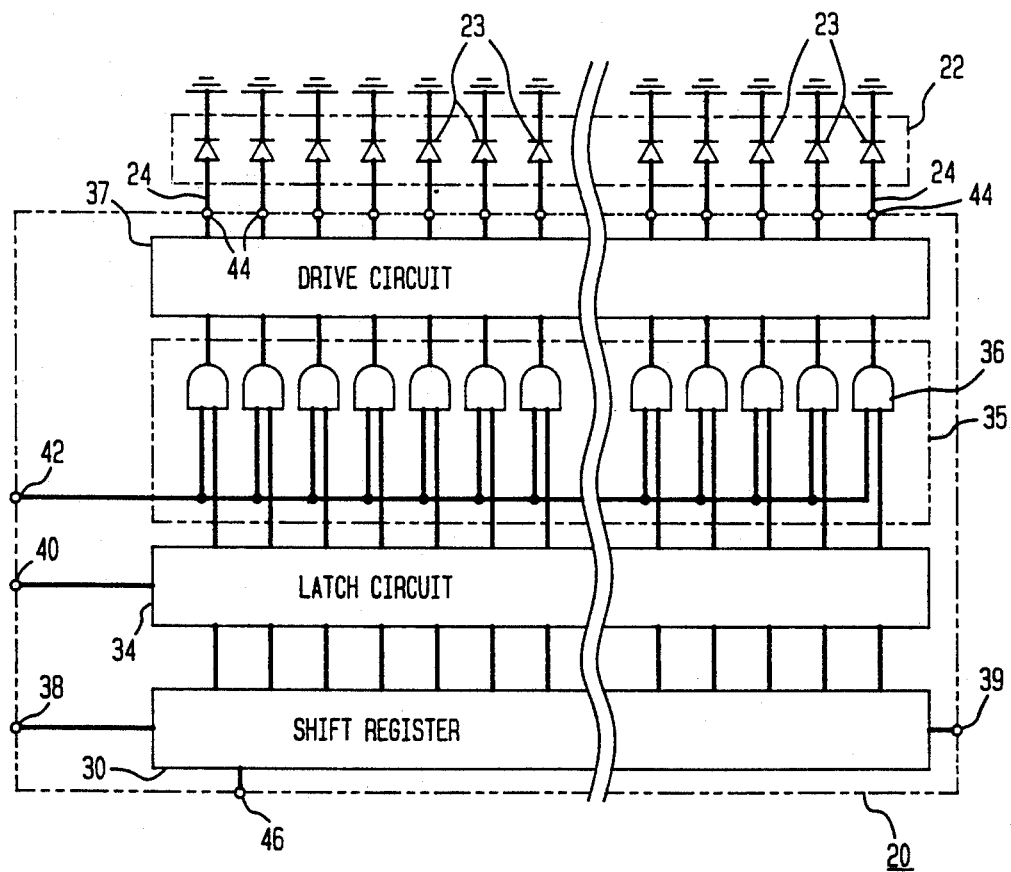
FIG. 2 shows an LED array driver IC and LED array arrangement used in the prior art light-emitting apparatus of FIG. 1.
Figure 3:
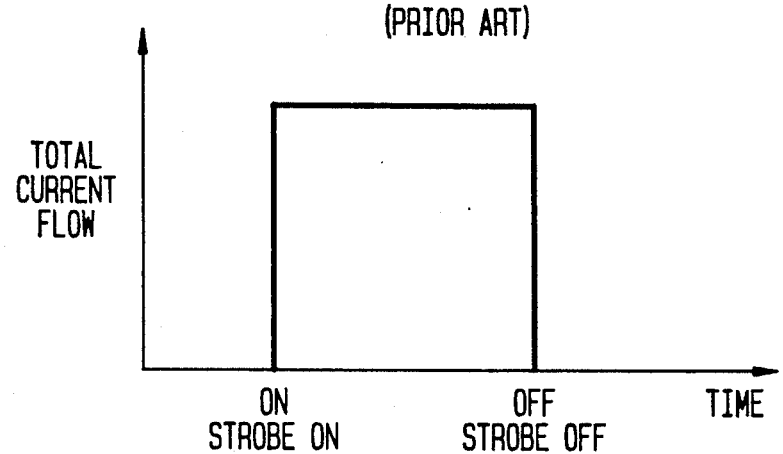
FIG. 3 is an explanatory diagram showing current flow levels in the prior art light-emitting apparatus of FIG. 1.

This time-delayed phasing-in operation of the LEDs 68 prevents the type of large current impulses produced by the prior art apparatus 10 shown in FIGS. 1, 2, and 3 when all of the LEDs 68 are simultaneously switched on. The time-delayed phasing-in operation in accordance with the first embodiment of the present invention makes it possible to suppress the generation of electromagnetic radiation interference (EMI) in the prior art arrangement of the apparatus 10 of FIG. 1 as modified and shown in FIGS. 4, 5, and 6.

Figure 7:
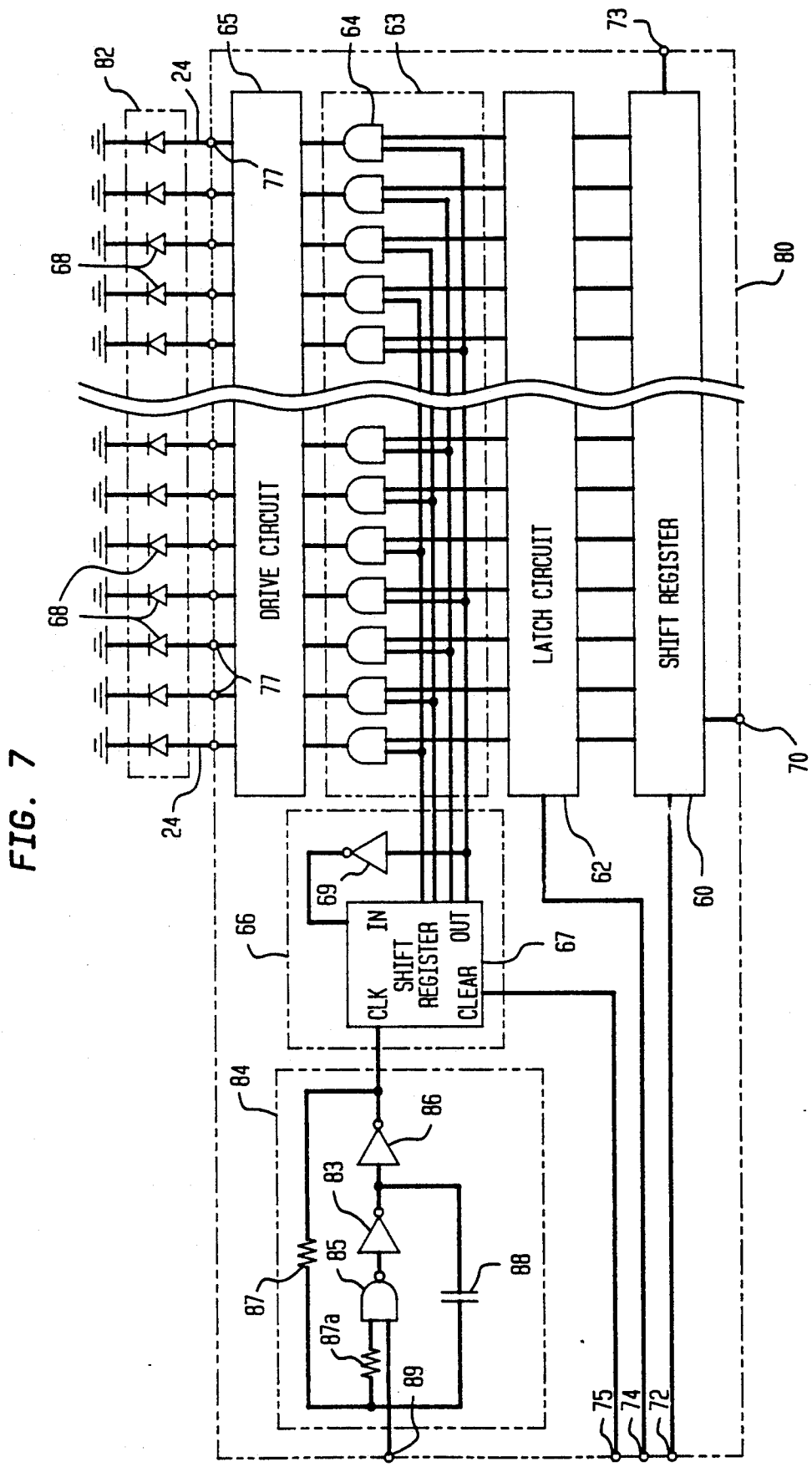
FIG. 7 shows an arrangement of an LED array driver IC and LED array in a light emitting apparatus similar to FIG. 1 in accordance with a second embodiment of the present invention.

Referring now to FIG. 7, there is shown an arrangement of an LED array driver IC 80 (shown within a first dashed line rectangle) and LED array 82 (shown within a second dashed line rectangle) in accordance with a second embodiment of the present invention. It is to be understood that in accordance with the second embodiment, the LED array driver IC 80 and the LED array 82 shown in FIG. 7 are useful as replacements for the combination of the LED array driver IC 20 and the LED array 22, respectively, in the light-emitting apparatus 10 of FIG. 1. It is to be noted that the driver LED array driver IC 80 and the LED array 82 of FIG. 7 comprise elements which are identical to elements found in the LED array driver IC 50 and LED array 52 of FIG. 4. Such identical elements have been given the same designation numbers in FIG. 7 as found in FIGS. 4. However, compared to the arrangement of the first embodiment of the present invention shown in FIG. 4, the LED array driver IC 80 of the second embodiment of FIG. 7 further comprises a clock generator 84 (shown within a dashed line rectangle). The clock generator 84 comprises a NAND circuit 85 (a two input NAND gate) having first and second inputs and an output, first and second inverters 83 and 86, first and second resistors 87 and 87a, and a capacitor 88. A clock switch pad 89 is coupled to the first input of the NAND circuit 85. The output of NAND circuit 85 is coupled to an input of inverter 83 whose output is coupled to an input of inverter 86 and a first terminal of capacitor 88. An output of the inverter 86 is coupled to a first terminal of resistor 87 and to the CLK input of shift register 67. Second terminals of resistor 87 and capacitor 88 are coupled to a first terminal of resistor 87a. A second terminal of resistor 87a is coupled to the second input of NAND circuit 85. The clock operation is controlled via a clock switch pad 89 which is connected to the first input of the NAND circuit 85. The clock frequency is set by adjusting the values of the resistance 87 and the capacitor 88. This arrangement using the clock generator 84 permits a decrease by a one-line amount in the clock signal lines on the spreader board 28 (shown in FIG. 1) that are a source of EMI.

Figure 8:
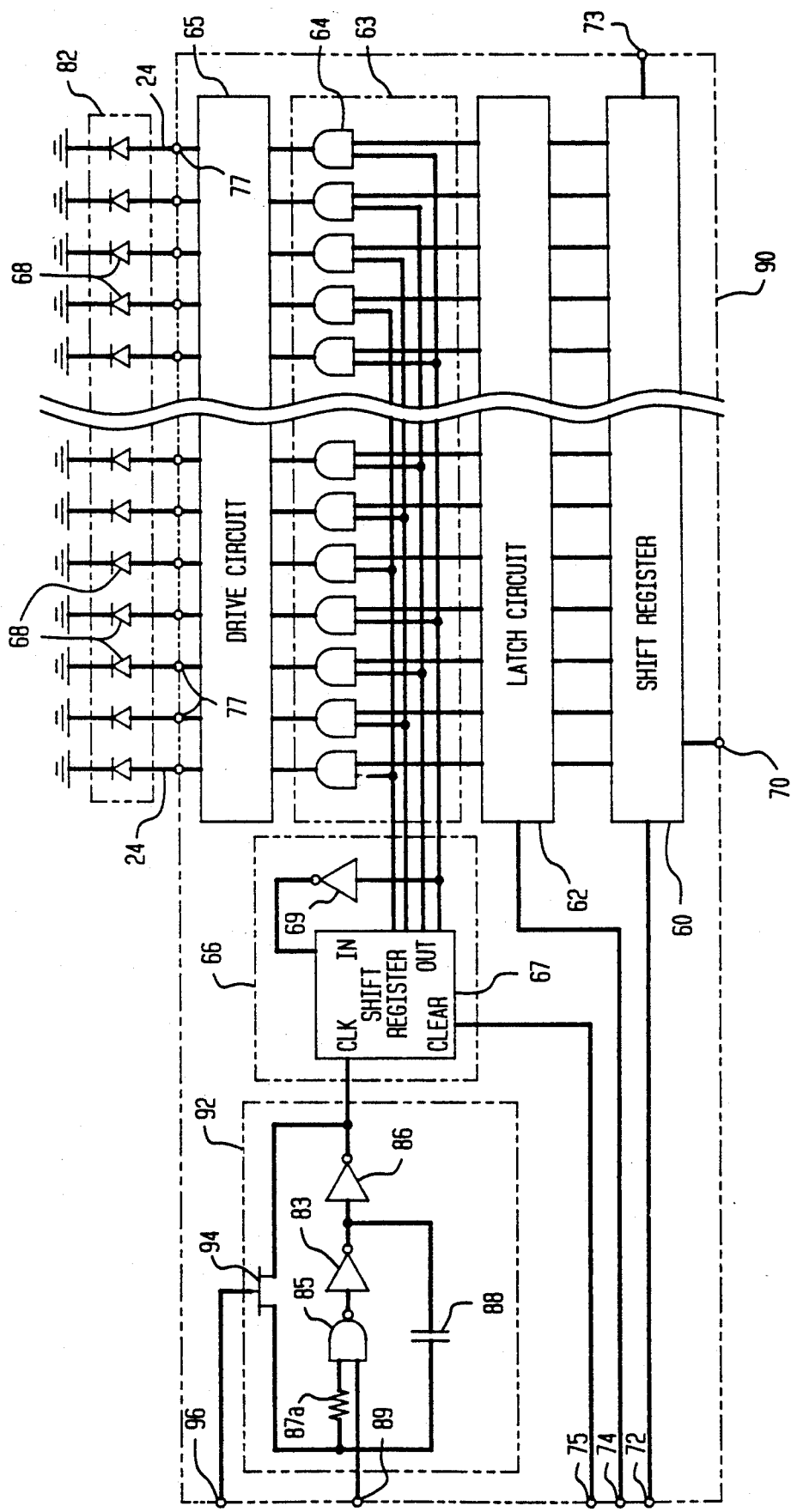
FIG. 8 shows an arrangement of an LED array driver IC and LED array in a light emitting apparatus similar to FIG. 1 in accordance with a third embodiment of the invention.

Referring now to FIG. 8, there is shown an arrangement of an LED array driver IC 90 (shown within a first dashed line rectangle) and an LED array 82 (shown within a second dashed line rectangle) in accordance with a third embodiment of the present invention. It is to be understood that in accordance with the third embodiment of the present invention, the LED array driver IC 90 and the LED array 82 shown in FIG. 8 are useful as replacements for the combination of the LED array driver IC 20 and the LED array 22, respectively, in the light-emitting apparatus 10 of FIG. 1. It is to be noted that the LED array driver IC 90 and the LED array 82 of FIG. 8 comprise elements which are identical to elements found in the LED array driver IC 50 and LED array 52 of FIG. 4 and the LED array driver IC 84 and LED array 82 of FIG. 7. Such identical elements have been given the same designation numbers in FIG. 8 as found in FIGS. 4 and 7. However, compared to the arrangement of the second embodiment of the present invention shown in FIG. 7, the LED array driver IC 90 of the third embodiment of FIG. 8 further comprises a clock generator 92 (shown within a dashed line rectangle). More particularly, the clock generator 92 is essentially identical to the clock generator 84 of FIG. 7 except that a field effect transistor (FET) 94 replaces the resistance 87 in the clock generator 84 of FIG. 7. The FET 94 has a source and drain electrode disposed in the feedback path between the output of inverter 86 and the first terminal of the resistor 87a, and a bias electrode coupled to a clock frequency control pad 96. The operation of the clock generator 92 is controlled via a clock switch pad 89 which is coupled to the first input of the NAND circuit 85. As is well known, the resistance between the drain and source electrodes in a field-effect transistor depends on the bias voltage applied to the gate electrode of the FET 94. This characteristic of the field-effect transistor 94 is utilized to provide external control of the exposure time for the latched data signals to the drive circuit 65 by the application of a controlled external bias to the clock frequency control pad 96 connected to the gate electrode of the FET 94. This controlled external bias controls the frequency of the clock signals produced by the clock generator 92.

Figure 9:
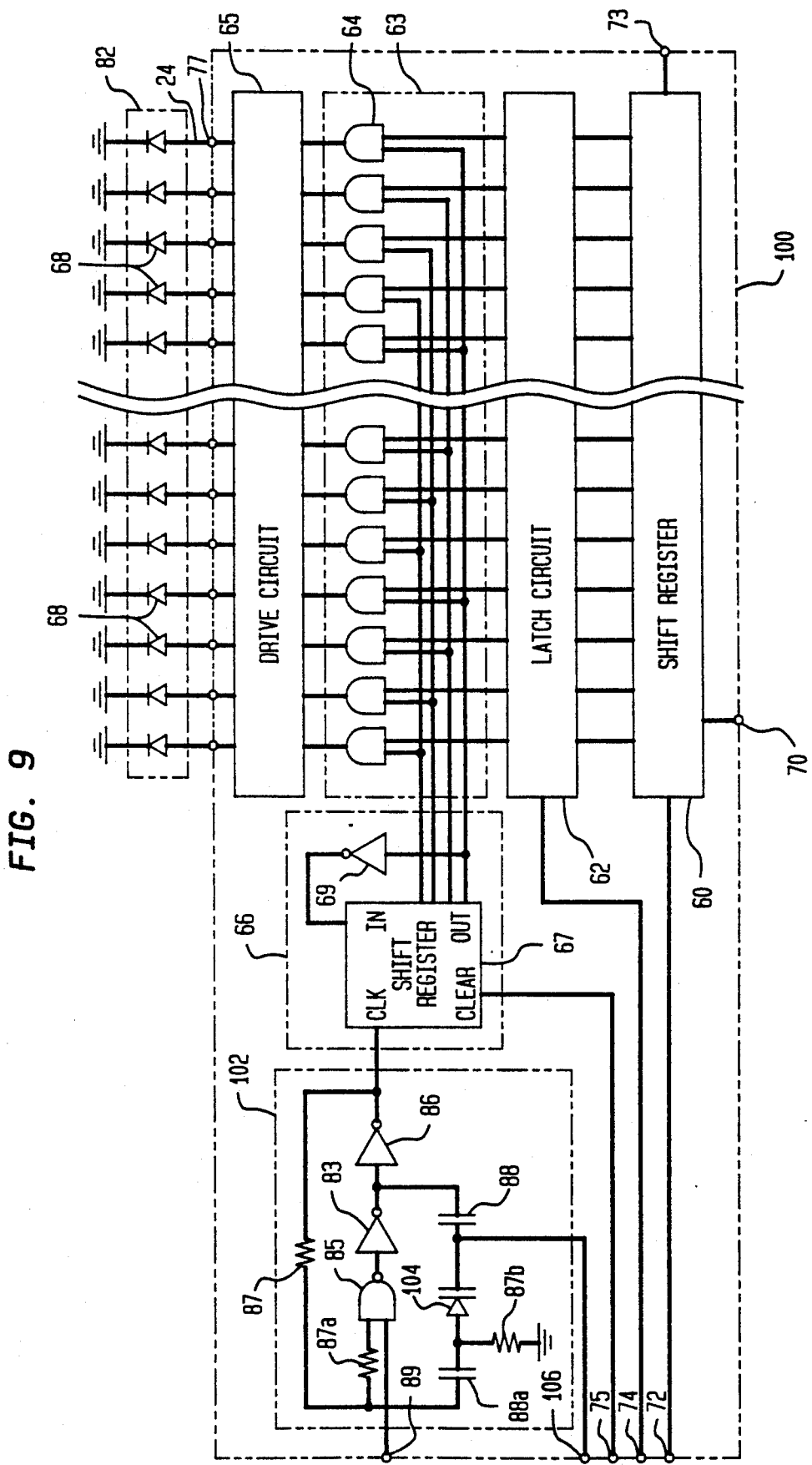
FIG. 9 shows an arrangement of an LED array driver IC and LED array in a light emitting apparatus similar to FIG. 1 in accordance with a fourth embodiment of the invention.

Referring now to FIG. 9, there is shown an arrangement of an LED array driver IC 100 (shown within a first dashed line rectangle), and an LED array 82 (shown within a second dashed line rectangle) in accordance with a fourth embodiment of the present invention. It is to be understood that in accordance with the fourth embodiment, the LED array driver IC 100 and the LED array 82 shown in FIG. 9 are useful as replacements for the combination of the LED array driver IC 20 and the LED array 22, respectively, in the light-emitting apparatus 10 of FIG. 1. It is to be noted that the driver LED array driver IC 100 and the LED array 82 of FIG. 9 comprise elements which are identical to elements found in the LED array driver IC 84 and 92 of FIGS. 7 and 8, respectively, and in LED array 84 of FIGS. 7 and 8. Such identical elements have been given the same designation numbers in FIG. 9 as found in FIGS. 7, and 8. However, compared to the arrangement of the second embodiment of the present invention shown in FIG. 7, the LED array driver IC 100 of the fourth embodiment of FIG. 9 further comprises a clock generator 102 (shown within a dashed line rectangle). The clock generator 102 is essentially identical to the clock generator 84 of FIG. 7 except that first and second capacitors 88 and 88a with a variable capacitance diode 104 therebetween replace the single capacitance 88 of the clock generator 84 of FIG. 7. More particularly, the output of inverter 83 is coupled to an input of inverter 86 and to a first terminal of capacitor 88. The second terminal of capacitor 88 is coupled to a first terminal of the variable capacitance diode 104 and to a pad 106. A second terminal of the variable capacitance diode 104 is coupled to ground through resistor 88a and to a first terminal of capacitor 88a. A second terminal of capacitor 88a is coupled to the first terminal of resistor 87a. It is to be understood that the junction capacity of a variable capacitance diode 104 can be varied by applying a variable reverse bias across the variable capacitance diode 104. This characteristic of a varied junction capacity is utilized to provide external control of the exposure time for the latched data signals by the application of a controlled external bias to a clock frequency control pad 106. The controlled external bias controls the frequency produced by the clock generator 102 which, in turn, controls the exposure time of the latched data signals at the LEDs 86. The same effect provided by the variable capacitance diode 104 is also achievable by utilizing the transistor junction capacity or diode junction capacity of the diode 104. The arrangement of the fourth embodiment of the present invention shown in FIG. 9 enables the exposure time for the latched data signals to be controlled, either at the level of the entire light-emitting apparatus similar to FIG. 1 as modified by FIG. 9, or at the LED array 82 level, through external control of the applied voltage to pad 106.

It is to be appreciated and understood that the specific embodiments of the invention described hereinabove are merely illustrative of the general principles of the invention. Various other modifications may be made by those of ordinary skill in the art which are consistent with the principles set forth. For example, there may be other arrangements of a clock generator for use in the LED array driver ICs 80, 90, or 100 of FIGS. 7, 8, or 9, respectively, which provide functions similar to the respective clock generators 84, 92, and 102 disclosed in accordance with the second, third and fourth embodiments of the present invention.

What is claimed is:

1. Light-emitting apparatus comprising:
   an array of a plurality of light emitting diodes (LEDs); and
   LED array driver integrated circuit (IC) means comprising:
   register and latching means for receiving and storing LED array drive signals;
   strobe signal generating means for sequentially generating strobe signals with mutually different time delays;
   strobing circuitry for controlling the operation of the LEDs of the LED array by generating a logical product (AND) of the LED array drive signals from the register and latching means and the strobe signals from the strobe signal generating means to provide sequential drive signals to different sections of the LEDs of the LED array that are based on the strobe signals from the strobe signal generating means; and
   the LED array driver IC means further comprises clock generating circuitry for providing the strobe signal generating means with clock signals,
   wherein the clock generating circuitry includes:
   an input terminal and an output terminal,
   a NAND circuit having first and second inputs and an output, where the first input is coupled to the input terminal,
   a first and a second signal inverting means coupled in series with the output of the NAND circuit;
   resistance means disposed in a feedback path between the output terminal and the second input of the NAND circuit, and
   capacitance means disposed in a feedback path between a point in the serial connection between the first and second inverters and the second input of the NAND circuit.

2. The light emitting apparatus of claim 1 wherein the operation of the clock generating circuitry is controlled via the input terminal, and the frequency of the clock signals at the output terminal of the clock generating circuitry is set by adjusting values of the resistance means and capacitance means.

3. The light-emitting apparatus of claim 1 wherein the clock generating circuitry comprises:
   a first and second input terminal, and an output terminal;
   a NAND circuit comprising a first and second input and an output, where the first input is coupled to the first input terminal,
   a first and a second signal inverting means coupled in series with the output of the NAND circuit;
   a field effect transistor (FET) having a drain and a source electrode disposed in a feedback path between the output terminal and the second input of the NAND circuit, and a gate electrode which is connected to the second input terminal; and capacitance means disposed in a feedback path between a point in the serial connection between the first and second inverters and the second input of the NAND circuit.

4. The light-emitting apparatus of claim 3 wherein a bias voltage is applied to the second input terminal and to the gate electrode of the FET for controlling the resistance between the drain and source electrodes and, in turn, the frequency of the clock signals at the output terminal of the clock generating means.

5. The light-emitting apparatus of claim 1 wherein the clock generating circuitry comprises:
   a first and a second input terminal, and an output terminal;
   a NAND circuit comprising a first and second input and an output, where the first input is coupled to the first input terminal,
   a first and a second signal inverting means coupled in series with the output of the NAND circuit;
   resistance means disposed in a feedback path between the output terminal and the second input of the NAND circuit; and
   capacitance means and a variable capacitance diode serially connected in a feedback path between a point in the serial connection between the first and second inverters and the second input of the NAND circuit, a first and a second side of the variable capacitance diode are connected to ground and the second input terminal, respectively.

6. The light-emitting apparatus of claim 5 wherein the magnitude of a bias voltage applied to the second input terminal varies a junction capacity of the variable capacitance diode to control the frequency of the clock signals at the output terminal of the clock generating circuitry.

7. Light-emitting apparatus comprising:
   an array of a plurality of light emitting diodes; and
   LED array driver integrated circuit (IC) means comprising:
   register and latching means for receiving and storing LED array drive signals;
   strobe signal generating means for sequentially generating strobe signals with mutually different time delays;
   strobing circuitry for controlling the operation of the LEDs of the LED array by generating a logical product (AND) of the LED array drive signals from the register and latching means and the strobe signals from the strobe signal generating means to provide sequential drive signals to different sections of the LEDs of the LED array that are based on the strobe signals from the strobe signal generating means; and
   clock generating circuitry for providing the strobe signal generating means with clock signals, wherein the clock generating circuitry comprises:
   an input terminal and an output terminal;
   a NAND circuit having first and second inputs and an output, where the first input is coupled to the input terminal,
   a first and a second signal inverting means coupled in series with the output of the NAND circuit;
   resistance means disposed in a feedback path between the output terminal and the second input of the NAND circuit, and
   capacitance means disposed in a feedback path between a point in the serial connection between the first and second inverters and the second input of the NAND circuit.

8. The light emitting apparatus of claim 7 wherein the operation of the clock generating circuitry is controlled via the input terminal, and the frequency of the clock signals at the output terminal of the clock generating circuitry is set by adjusting values of the resistance means and capacitance means.

9. The light-emitting apparatus of claim 7 wherein the clock generating circuitry comprises:
   a first and second input terminal, and an output terminal;
   a NAND circuit comprising a first and second input and an output, where the first input is coupled to the first input terminal;
   a first and a second signal inverting means coupled in series with the output of the NAND circuit;
   a field effect transistor (FET) having a drain and a source electrode disposed in a feedback path between the output terminal and the second input of the NAND circuit, and a gate electrode which is connected to the second input terminal; and
   capacitance means disposed in a feedback path between a point in the serial connection between the first and second inverters and the second input of the NAND circuit.

10. The light-emitting apparatus of claim 7 wherein a bias voltage is applied to the second input terminal and to the gate electrode of the FET for controlling the resistance between the drain and source electrodes and, in turn, the frequency of the clock signals at the output terminal of the clock generating means.

11. The light-emitting apparatus of claim 9 wherein the clock generating circuitry comprises:
   a first and a second input terminal, and an output terminal;
   a NAND circuit comprising a first and second input and an output, where the first input is coupled to the first input terminal;
   a first and a second signal inverting means coupled in series with the output of the NAND circuit;
   resistance means disposed in a feedback path between the output terminal and the second input of the NAND circuit; and
   capacitance means and a variable capacitance diode serially connected in a feedback path between a point in the serial connection between the first and second inverters and the second input of the NAND circuit, a first and a second side of the variable capacitance diode are connected to ground and the second input terminal, respectively.

12. The light-emitting apparatus of claim 11 wherein the magnitude of a bias voltage applied to the second input terminal varies a junction capacity of the variable capacitance diode to control the frequency of the clock signals at the output terminal of the clock generating circuitry.

* * * * *